(12) United States Patent
Frougier et al.

(10) Patent No.: US 12,027,224 B2
(45) Date of Patent: Jul. 2, 2024

(54) AUTHENTICITY AND YIELD BY READING DEFECTIVE CELLS

(71) Applicant: International Business Machines Corporation, Armonk, NY (US)

(72) Inventors: Julien Frougier, Albany, NY (US); Kangguo Cheng, Schenectady, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/654,998

(22) Filed: Mar. 16, 2022

(65) Prior Publication Data
US 2023/0298683 A1    Sep. 21, 2023

(51) Int. Cl.
| | |
|---|---|
| *G11C 29/44* | (2006.01) |
| *G11C 11/16* | (2006.01) |
| *G11C 29/02* | (2006.01) |
| *G11C 29/12* | (2006.01) |
| *G11C 29/24* | (2006.01) |
| *G06F 12/1018* | (2016.01) |
| *G11C 29/18* | (2006.01) |

(52) U.S. Cl.
CPC ...... *G11C 29/4401* (2013.01); *G11C 11/1653* (2013.01); *G11C 11/1659* (2013.01); *G11C 11/1673* (2013.01); *G11C 29/024* (2013.01); *G11C 29/1201* (2013.01); *G11C 29/24* (2013.01); *G06F 12/1018* (2013.01); *G11C 2029/1802* (2013.01); *G11C 2029/4402* (2013.01)

(58) Field of Classification Search
None
See application file for complete search history.

(56) References Cited

U.S. PATENT DOCUMENTS

| | | |
|---|---|---|
| 5,995,422 A | 11/1999 | Im |
| 6,304,500 B1 | 10/2001 | Kyung |
| 6,320,801 B1 * | 11/2001 | Kwak ............... G11C 29/808 |
| | | 365/189.11 |
| 6,538,940 B1 | 3/2003 | Nahas |

(Continued)

FOREIGN PATENT DOCUMENTS

| | | |
|---|---|---|
| DE | 102012106454 A1 | 1/2013 |
| JP | 2013-131869 A * | 7/2013 |
| KR | 100812850 B1 | 4/2004 |

OTHER PUBLICATIONS

A machine translation of JP 2013-131869 A (Year: 2013).*

(Continued)

*Primary Examiner* — Sultana Begum
(74) *Attorney, Agent, or Firm* — Gavin Giraud

(57) ABSTRACT

Embodiments disclosed herein include a semiconductor device. The semiconductor device may include a magnetoresistive random access memory (MRAM) array. The MRAM array may include defective MRAM cells, redundancy MRAM cells, and operational MRAM cells. The semiconductor device may also include an address input electrically connected to the MRAM array and a selector circuit wired to the address input and an output of the MRAM array. The selector circuit may be configured to read the defective MRAM cells to identify the MRAM array.

18 Claims, 5 Drawing Sheets

(56) References Cited

U.S. PATENT DOCUMENTS

| | | |
|---|---|---|
| 7,370,251 B2 | 5/2008 | Nadeau-Dostie |
| 9,123,429 B2 | 9/2015 | Kurjanowicz |
| 9,495,627 B1 | 11/2016 | Annunziata |
| 9,875,155 B2 | 1/2018 | Sohn |
| 10,134,487 B2 | 11/2018 | Kwon |
| 10,235,258 B2 | 3/2019 | Son |
| 10,761,997 B2 | 9/2020 | Troia |
| 2013/0077376 A1 | 3/2013 | Kim |
| 2015/0071432 A1 | 3/2015 | Zhu |

OTHER PUBLICATIONS

Wang et al., "Hardware implementation of physically unclonable function (puf) in perpendicular STT MRAM", Proceedings of the 2017 International Symposium on VLSI Technology, Systems and Application (VLSI-TSA), HIsinchu, Taiwan, Apr. 24-27, 2017, 2 pages.

\* cited by examiner

AUTHENTICITY AND YIELD BY READING DEFECTIVE CELLS

BACKGROUND

The present invention relates generally to the field of magnetic random access memory (MRAM), and more particularly to reading failed or weak MRAM cells to determine authenticity and improve yield.

MRAM is a type of non-volatile random-access memory (RAM) which stores data in magnetic domains. Unlike conventional RAM technologies, data in MRAM is not stored as electric charge or current flows, but by magnetic storage elements formed from two ferromagnetic plates, each of which can hold a magnetization, separate by a thin insulating layer. One of the two plates is a permanent magnet set to a particular polarity. The other plate's magnetization can be changed to match that of an external field to store memory.

Counterfeiting semiconductors has been a rapidly increasing trend, impacting a wide variety of electronics systems and people. The detection of counterfeit components has become an increasingly important priority for electronics manufacturers and component suppliers worldwide. The risks of counterfeit semiconductors are often misinterpreted and underestimated. Semiconductors are the "brains" inside critically important electronic systems, including medical equipment, power grids, communications systems, automotive braking and airbag systems, and military and aerospace systems.

SUMMARY

Aspects of an embodiment of the present invention include a semiconductor structure. The semiconductor structure may include a magnetoresistive random access memory (MRAM) array. The MRAM array may include defective MRAM cells, redundancy MRAM cells, and operational MRAM cells. The semiconductor device may also include an address input electrically connected to the MRAM array and a selector circuit wired to the address input and an output of the MRAM array. The selector circuit may be configured to read the defective MRAM cells to identify the MRAM array.

Aspects of an embodiment of the present invention include methods of fabricating a semiconductor structure. The methods may include identifying defective magnetoresistive random access memory (MRAM) cells of an MRAM array, identifying redundancy MRAM cells to replace the defective MRAM cells during normal operation, and reading the defective MRAM cells to identify the MRAM array.

Aspects of an embodiment of the present invention include a method. The method may include receiving, at a selector circuit, a normal operation signal, in response to the normal operation signal, enabling redundancy magnetoresistive random access memory (MRAM) cells within an MRAM array. The redundancy MRAM cells may be replacements for defective MRAM cells in the MRAM array. The method may also include receiving, at the selector circuit, a chip authentication signal, in response to the chip authentication signal, reading the defective MRAM cells, and identifying the MRAM array based on the reading of the defective MRAM cells.

DETAILED DESCRIPTION

Figure 1A:
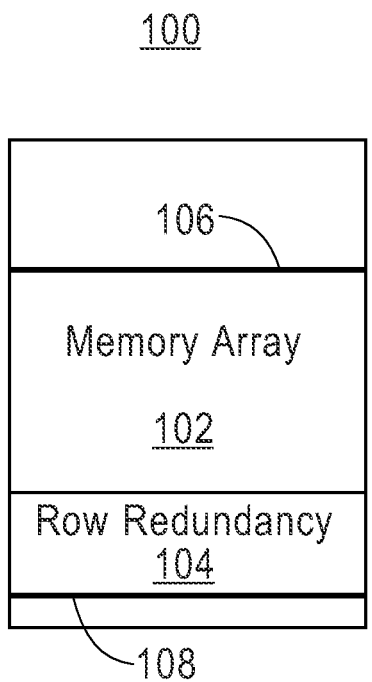
FIG. 1A depicts schematic diagram of a semiconductor device having a magnetoresistive random access memory (MRAM) array with rows of redundancy MRAM cells, in accordance with one embodiment of the present invention.

In the following detailed description, reference is made to the accompanying drawings, which show specific examples of embodiments of the invention. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

Technical measures to solve the issue of counterfeiting have previously included visual inspection of devices for marking errors, which needs a trained eye for all possible variations in marking. Electronically testing or x-raying every incoming batch is another technique. Another destructive method is to use a complex decapsulation method to visually inspect the IC die with a microscope, immediately losing revenue due to the component's destruction. These methods of counterfeit prevention can be expensive, time-consuming, and require complex training, skilled operators, and expensive equipment.

With integrated circuits (ICs) developing with ever-increasing numbers of transistor cells, it is inevitable that a number of the cells will experience defects. During finishing and packaging of the ICs, the defective cells may be replaced with redundancy cells that are fabricated concurrently with the primary memory array, but only used for replacement. The defective cells may then be disconnected from the IC, and any circuit interacting with that IC may not even be aware of where the defective cells are, or even that there ever were defective cells. In certain embodiments of the present invention, however, the addresses of the defective cells may be used to identify and authenticate the IC due to the highly randomized and individual nature of the location of the defective cells. Due to the naturally random distribution of defective cells, a unique ID is produced for IC in a natural way.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "certain embodiments," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "above," "below," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Each reference number may refer to an item individually or collectively as a group. For example, operational cell 216 may refer to a single operational cell 216 or multiple operational cells 216.

The present invention will now be described in detail with reference to the Figures.

FIG. 1A depicts a block diagram of a semiconductor device 100, in accordance with one embodiment of the present invention. The semiconductor device 100 may be fabricated for inclusion within an integrated circuit (IC), and may include rows and columns of cells (e.g., transistor devices, magnetoresistive random access memory (MRAM) cells) arranged in a memory array 102. The semiconductor device 100 may have connections (not shown) that enable various other circuit components to read, write, or otherwise adjust the cells within the memory array 102.

The semiconductor device 100 may also include redundancy cells embodied in a row redundancy 104. The row redundancy 104 may be fabricated concurrently with the cells of the memory array 102. The semiconductor device 100 may be designed to run with a specific number of cells when installed within the IC, and may thus be fabricated with this specific number of cells arranged in the rows and columns (i.e., with a designated number of cells in each row, and a designated number of rows). Some of the fabricated cells may be defects, however, and to maintain the designed number of cells in operation of the semiconductor device 100, the row redundancy 104 includes additional rows of cells (e.g., with the same number of cells as the rows of the memory array 102) as replacements. When a defect (e.g., defective cell or multiple defective cells) is detected on a defective row 106 within the memory array 102, the defective row 106 of the memory array 102 (i.e., the row with the defective cell) may be replaced with a replacement row 108 from the row redundancy 104.

Figure 1B:
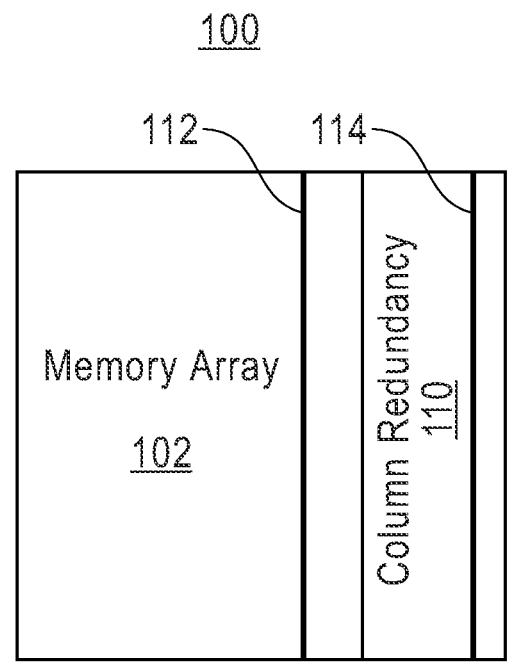
FIG. 1B depicts schematic diagram of a semiconductor device having an MRAM array with columns of redundancy MRAM cells, in accordance with one embodiment of the present invention.

The defective cells may also be replaced in the semiconductor device 100 by replacing a column of the memory array 102 with a column from a column redundancy 110 as illustrated in FIG. 1B. That is, when a defective cell is detected within the memory array 102, a defective column 112 of the memory array 102 (i.e., the column with the defective cell) may be replaced with a replacement column 114 from the column redundancy 110.

Figure 1C:
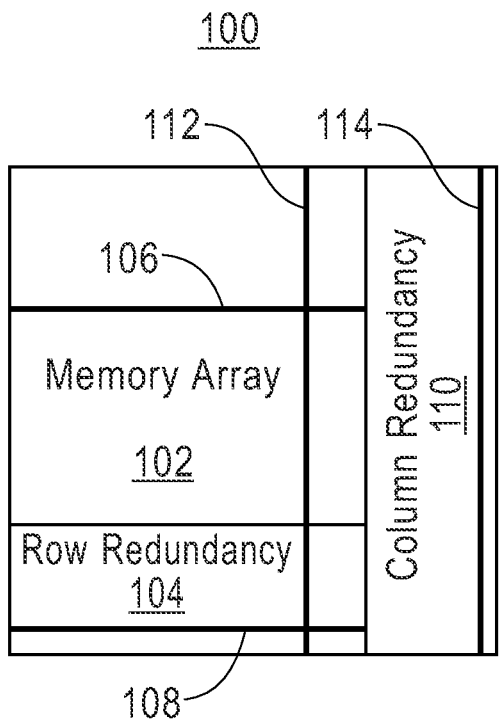
FIG. 1C depicts schematic diagram of a semiconductor device having an MRAM array with rows and columns of redundancy MRAM cells, in accordance with one embodiment of the present invention.

Furthermore, the semiconductor device 100 may include both the row redundancy 108 and the column redundancy 110, as illustrated in FIG. 1C. In such embodiments, when a defective cell is detected within the memory array 102, the entire row 106 or the entire column 112 of the memory array 102 (i.e., the row or column with the defective cell) may be replaced with the replacement row 108 from the row redundancy 104 or the replacement column 114 from the column redundancy 110.

Figure 2:
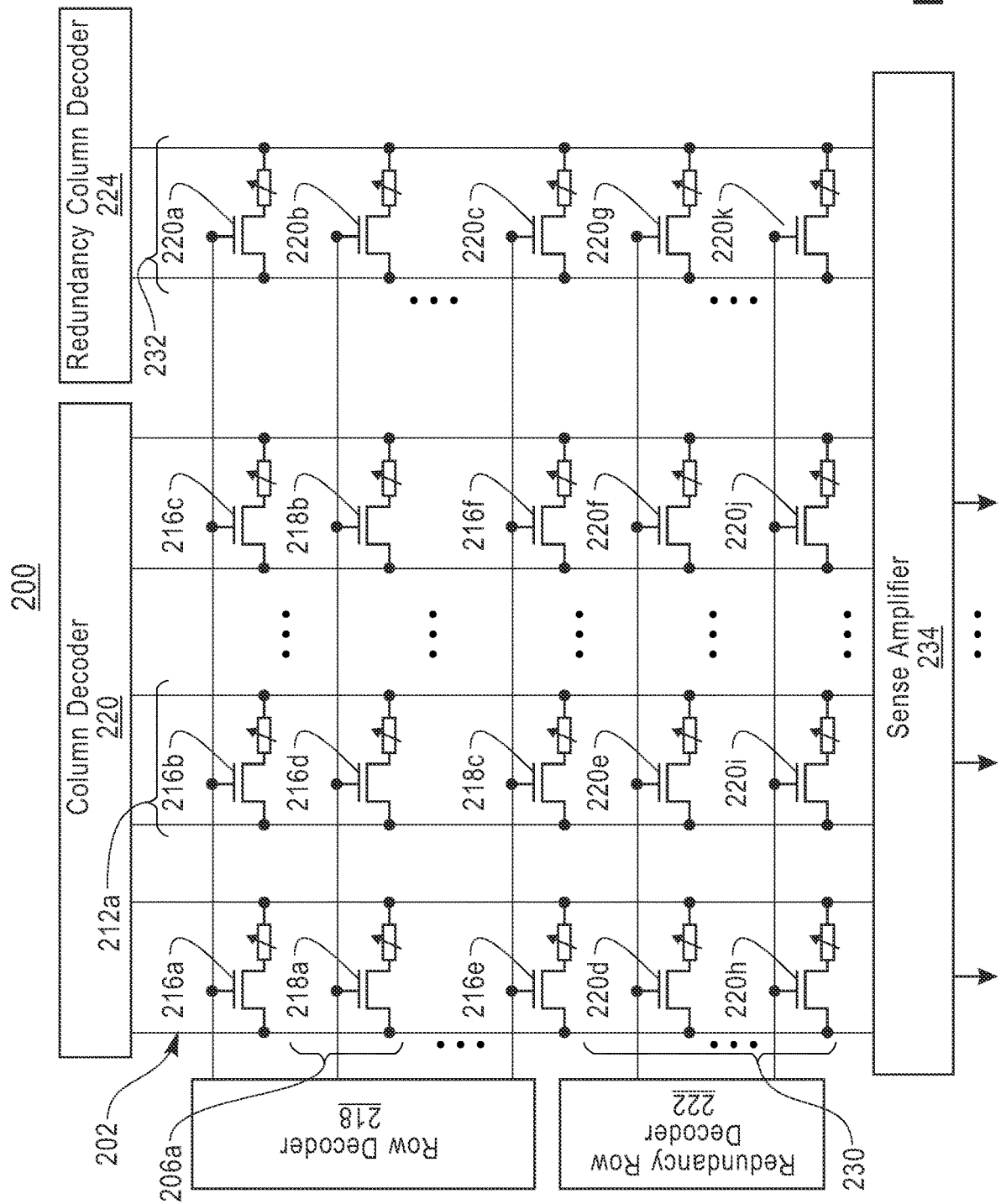
FIG. 2 depicts a schematic view of a semiconductor device having a memory array, in accordance with an embodiment of the present invention.

FIG. 2 depicts a schematic view of a semiconductor device 200 having a memory array 202, in accordance with an embodiment of the present invention. The semiconductor device 200 is depicted with individual magnetoresistive random access memory (MRAM) cells arranged in rows and columns. The MRAM cells in the illustrated embodiment include designations of operational MRAM cells 216a-f, defective MRAM cells 218a, b, c, and redundancy MRAM cells 220a-k. The semiconductor device 200 may designate the MRAM cells further (e.g., more designations such a failed MRAM cells or weak MRAM cells), and includes additional (e.g., millions) unillustrated MRAM cells that would be considered part of the memory array 202.

A row decoder 222 and a column decoder 224 enable the semiconductor device 200 to individually designate each operational MRAM cell 216a-f or defective MRAM cell 218a-c with an address. A redundancy row decoder 226 and a redundancy column decoder 228 similarly designate the redundancy MRAM cells 220a-k in redundancy rows 230 and redundancy columns 232. The redundancy rows 226 and/or the redundancy column 228 may be activated to replace defective MRAM cells. For example, the memory array 202 shows three defective cells: the first defective cell 218a at an address of: second row-first column; the second defective cell 218b at an address of: second row-nth column; and the third defective cell 218c at an address of: nth row-second column. Since the first defective cell 218a and the second defective cell 218b are located on the same row (i.e., second row labeled first defective row 206a), fabrication of the semiconductor device 200 may include replacing this first defective row 206a with a redundancy row 230. The third defective cell 218c, on the other hand, may utilize the redundancy column 232 to replace the first defective column 212a.

As explained in detail below, once the defective row 206a and defective column 212a have been replaced, the semiconductor device 200 may operate in an "operating mode" whereby the row decoder 218, column decoder 220, redundancy row decoder 222, and redundancy column decoder 224 send read/write signals only to the MRAM cells that will operate normally, ignoring the defective row 206a and the defective column 212a. A sense amplifier 234 is electrically connected to the memory array 202 and, during operating mode, does not distinguish between the operational MRAM cells 216a-f and the redundancy MRAM cells 220a-k. The semiconductor device 200 may also operate in an "authentication mode," whereby the defective cells 218a-c are read for the purpose of identifying and authenticating the semiconductor device 200, and the redundancy rows 230 and redundancy columns 232 are ignored.

Figure 3:
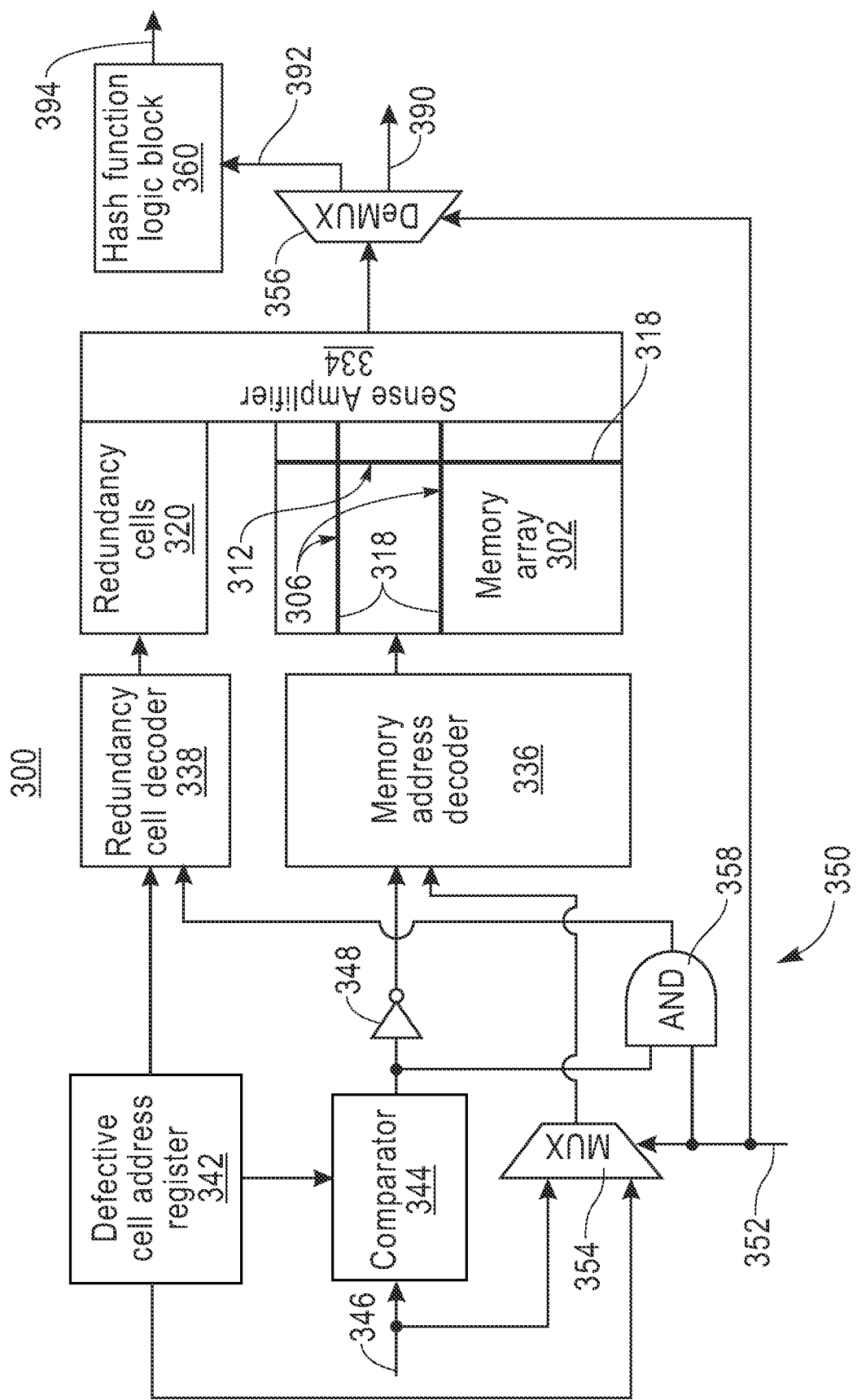
FIG. 3 depicts a schematic diagram of a semiconductor device, in accordance with an embodiment of the present invention.

FIG. 3 depicts a schematic diagram of a semiconductor device 300, in accordance with an embodiment of the present invention. The semiconductor device 300 includes components that operate similarly to components described above, and a selector circuit 350 configured to select between an operating mode and an authentication mode. Similar to the semiconductor device 200 described above, the semiconductor device 300 of FIG. 3 includes a memory array 302 and a sense amplifier 334 that operate like the memory array 202 and the sense amplifier 234 of FIG. 2. The semiconductor device 300 also includes a memory address decoder 336 that may include a row decoder, a column decoder, or both. Similarly, the semiconductor device 300 includes a redundancy cell decoder 338 that operates like the redundancy row decoder 226 and the redundancy column decoder 228 described above with regard to FIG. 2. The semiconductor device 300 also includes redundancy cells 320 that may be embodied as rows or columns as described above. The redundancy cells 320 replace defective cells 318 in defective rows 306 or defective columns 312 that are detected within the memory array 302. While only two defective rows 306 and one defective column 312 are illustrated, the memory array 302 may include more defective cells 318, and the illustration is limited only for simplicity of description.

Following fabrication of the memory array 302 of the semiconductor device 300, a defective cell address register 342 is generated and maintained, so that the address of each defective cell may be recorded for replacement, and for authentication. The defective cell address register 342 sends the addresses of defective cell addresses to a comparator 344, which compares the address to an address input signal delivered to an address input connection 346. If the address input signal matches the address from the defective cell address register 342, then the comparator 344 outputs a signal (e.g., logic "1"), which goes through an inverter 348 and becomes a signal of logic "0". The memory address decoder 336 receives the signal (e.g., logic "0") and does not read the defective cell (e.g., defective row or defective column). Thus, the defective cell address register 342 enables the semiconductor device 300 to avoid operation through the defective cells.

The selector circuit 350 controls the replacement or reading of defective cells by delivering enabling signals to the redundancy cell decoder 338 or the memory address decoder 336. The selector circuit 350 operates in "operating mode" or in "authentication mode" based on a mode signal delivered to a mode signal input 352. The operating mode is configured to enable the redundancy cells 320 and the authentication mode is configured to enable the defective MRAM cells 318 and not the redundancy cells 320.

When the selector circuit 350 is in operating mode (e.g., logic "1"), a multiplexer 354, an AND gate 358, and a demultiplexer 356 receive the operating mode signal. The operating mode signal causes the multiplexer 354 to output the address input from the address input connection 346. When the address input from the address input connection 346 matches any defective cell address in the defective cell address register 342, the comparator 344 outputs a logic "1", which is one of the inputs of the AND gate 358. When both inputs of the AND gate 358 are logic "1", the AND gate 358 outputs a logic "1" which enables the redundancy cell decoder 338. The redundancy cell decoder 338 uses the information stored in the defective cell address register 342 to replace the defective cells with the row or column of redundancy cells 320 assigned as the replacement. Meanwhile, the logic "1" signal from the output of the comparator 344 goes though the inverter 348 and becomes a logic "0" signal, disabling the memory address decoder 336.

When the address input from the address input connection 346 does not match any defective cell address in the defective cell address register 342, the comparator 344 outputs a logic "0", which is one of the inputs of the AND gate 358. The AND gate 358 outputs a logic "0" which disables the redundancy cell decoder 338. Meanwhile, the logic "0" signal from the output of the comparator 344 goes though the inverter 348 and becomes a logic "1" signal, enabling the memory address decoder 336 to operate on non-defective memory cells.

The operating mode signal (e.g., logic "1") causes the demultiplexer 356 to output the unmodified signal from the sense amplifier 334. Such an output signal from the demultiplexer 356 is labelled as 390.

When the selector circuit 350 is in authentication mode (e.g., logic "0"), the multiplexer 354, the AND gate 358, and the demultiplexer 356 receive the authentication mode signal. The authentication mode signal causes the multiplexer 354 to output the signal from the defective cell address register 342, which enables the defective cells 318 to be read by the sense amplifier 334. The authentication mode signal causes the AND gate 358 to output a logic "0" for any signals through the comparator 344. The AND gate 358 therefore disables the redundancy cell decoder 338 while the selector circuit 350 is in authentication mode. The authentication mode signal causes the demultiplexer 356 to output the signal 392 from the sense amplifier 334 to a hash engine 360. The hash function logic block 360 outputs a hash value 394 based on a reading of the defective MRAM cells 318. The hash value conceals the characteristics of each defective cell 318 so that the location or identification of the defective cells 318 is not known merely from reading the hash value. Additionally, the hash value enables the output value 394 with a pre-fixed number of bits (e.g., 256 bits) regardless of the number of defective cells 318 in the memory array 302.

Figure 4:
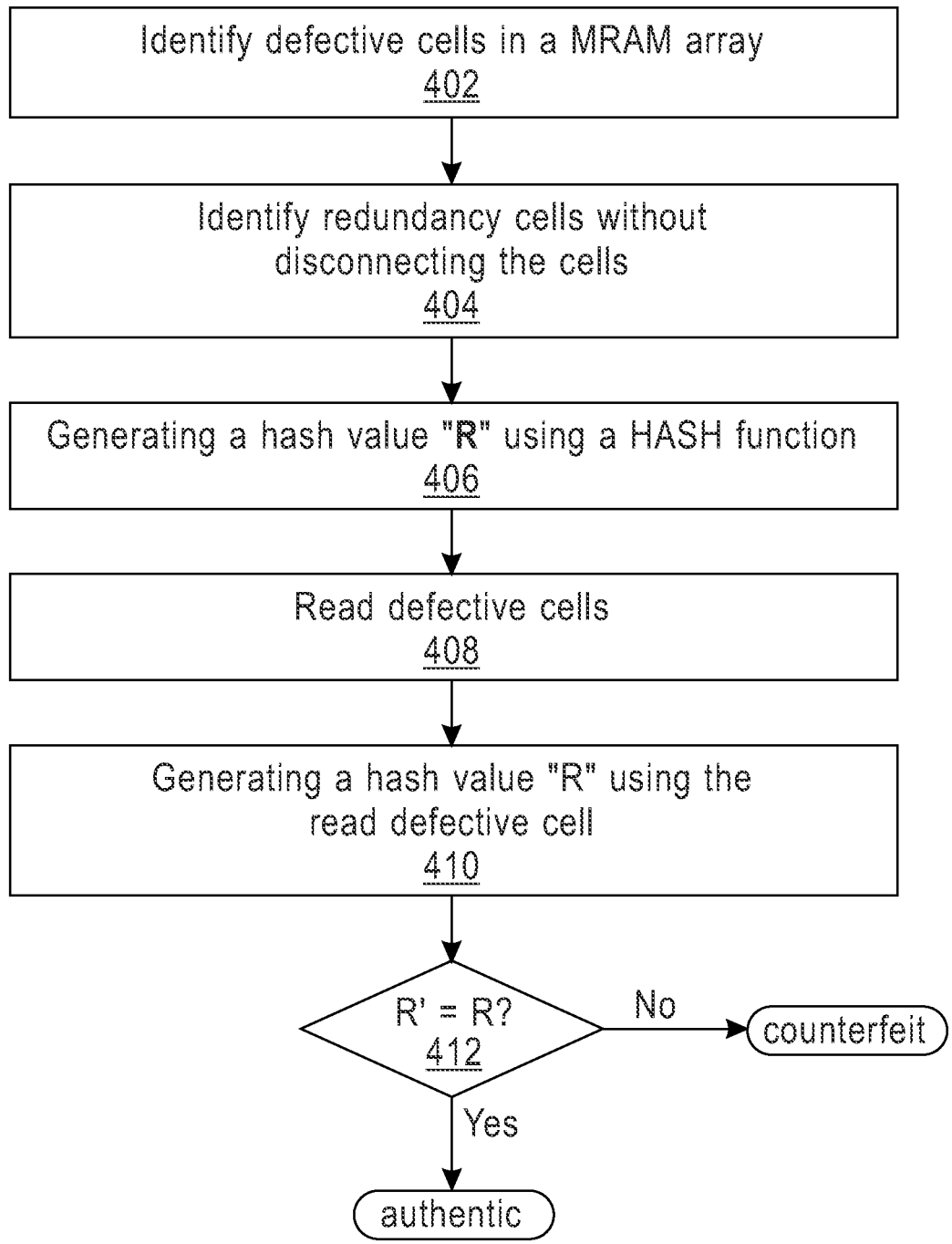
FIG. 4 depicts a flowchart illustrating a method of operating a semiconductor device, in accordance with one embodiment of the present invention.

FIG. 4 depicts a flowchart illustrating a method of operating a semiconductor device, in accordance with one embodiment of the present invention. The semiconductor device may identify defective cells in a memory array (block 402). The defective cells may be identified using known diagnostic methods that include identifying the address (e.g., row and column) of each defective cell. Furthermore, identifying the defective cells may include identifying a failed MRAM cell and a weak MRAM cell. A failed MRAM cell means that the cell is stuck at a constant value (either a logic "0" or logic "1) regardless of write signals, while a weak MRAM cell may respond somewhat to write signals, but not to a sufficient degree. For example, a weak MRAM cell may respond and change the read value, but be deemed a liability for long-term operation of the semiconductor device. There are two types of failed cells, failed "1" cells and failed "0" cells. A failed "1" cell means the cell is stuck at a logic "1" and a failed "0" cell means the cell is tuck at a logic "0". There are two types of weak cells, weak "1" cells and weak "0" cells. A weak "1" cell means the characteristics of the cell, upon a write "1" signal, achieves a value close to but not yet fully reaches the characteristics of good cells. For example, a weak "1" MRAM cell, upon a write "1" signal, may exhibit a resistance value that is close but still higher than resistance values of good "1" MRAM cells. Similarly, a weak "0" cell means the characteristics of the cell, upon a write "0" signal, achieves a value close to but not yet fully reaches the characteristics of good "0" MRAM cells. For example, a weak "0" MRAM cell, upon a write "0" signal, may exhibit a resistance value that is close but still lower than resistance values of good MRAM cells. Such distinction between the failed cells and the weak cells enables two bit identification which further increases security provided by reading the defective cells.

Figure 5:
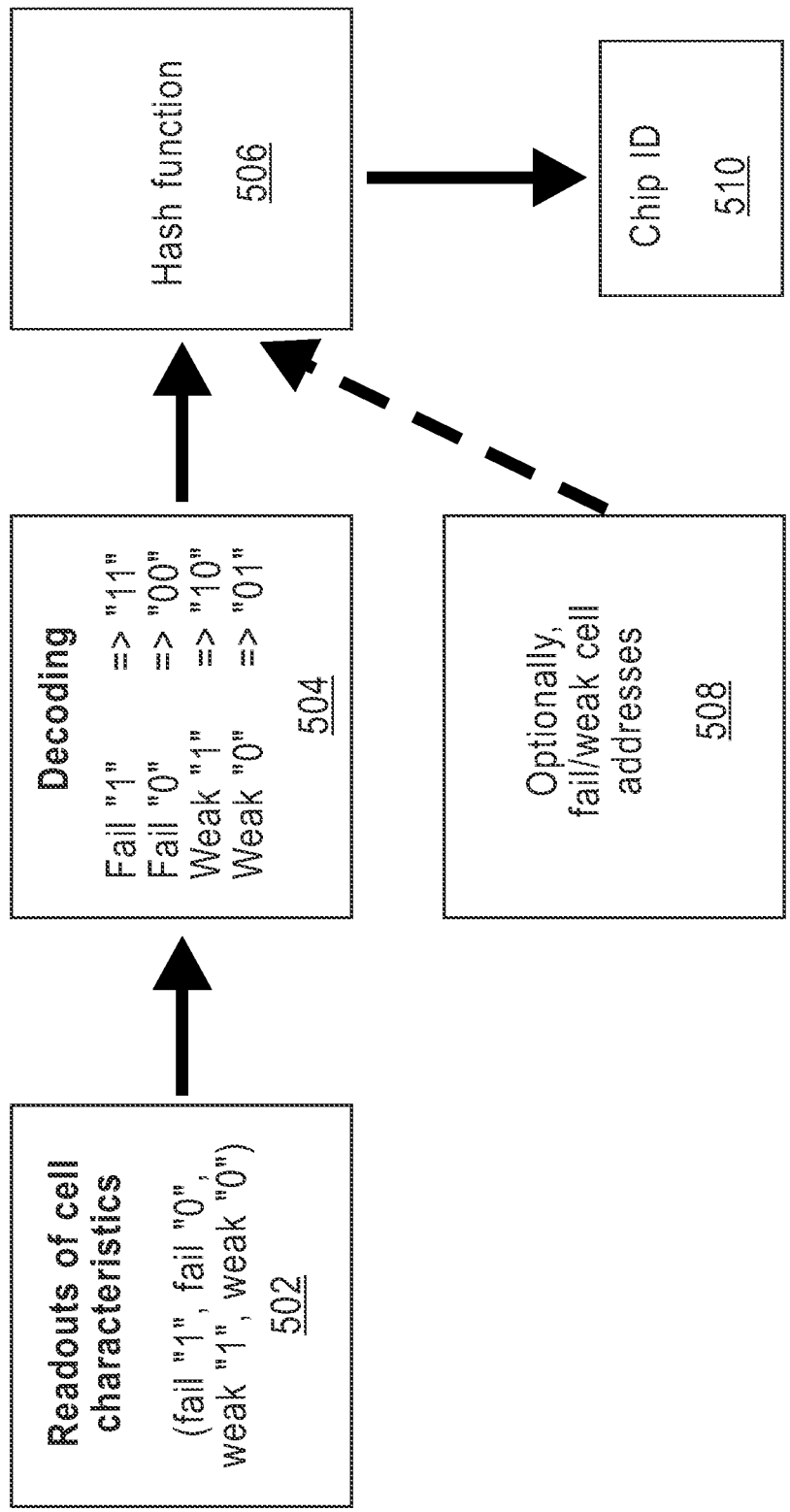
FIG. 5 depicts a chart depicting identifying steps that may be combined to produce the chip ID.

FIG. 5 depicts a chart depicting identifying steps that may be combined to produce the chip ID. A first piece of information includes a readout 502 of cell characteristics. The readout 502 may be taken, for example from the sense amplifier 334 depicted in FIG. 3. The selector circuit 350, in authentication mode, directs the semiconductor device 300 to read only the defective cells, which give a fail "1", fail "0", weak "1", or weak "0" value. The readout 502 may then be decoded into two-bit decoding values 504. That is, decoding a Fail "1" gives a "11" two-bit decoding value; decoding a Fail "0" gives a "00" two-bit decoding value; decoding a Weak "1" gives a "10" two-bit decoding value; and decoding a Weak "0" gives a "01" two-bit decoding value.

Turning back to FIG. 4, the semiconductor device may identify redundancy cells to replace the identified defective cells when the semiconductor device is in operating mode (block 404). As described above, the redundancy cells may include a row or a column that replaces the row of column of the identified defective cell.

The two-bit decoding values 504 are then fed to the hash function 506 to conceal the characteristics of each defective cell (block 406). The hash function 506 also serves the purpose of producing a fixed length of chip ID, regardless of the length of the input. For example, a SHA256 Hash function produces a 256-bit output. Optionally, defective cell addresses 508 can be combined with the two-bit decoding values 504 as input of the Hash function 506. The output of the hash function 506 is a chip id "R" 510 that is unique to each particular semiconductor device.

Once the chip id 510 is stored, a continuation of the method in FIG. 4 may occur at any point in the future to identify a particular semiconductor device. When a semiconductor device is presented for authentication, the selector circuit is given the authentication mode signal, and the defective cells (e.g., failed cell and weak cells) are read (block 408). The read defective cells may follow the flow shown in FIG. 5 to generate a hash value and a chip ID "R'" (block 410). The just-detected chip ID R' is then compared to the stored chip ID R (block 412). If the just-detected chip ID R' matches the stored chip ID R (block 412, Yes), then the semiconductor device is determined to be authentic. If the just-detected chip ID R' does not match the stored chip ID R (block 412, No), then the semiconductor device is determined to be counterfeit.

The embodiments disclosed herein thus provide increased security and counterfeit prevention by providing a unique chip ID for every semiconductor device based on a highly random and individualized occurrence of defective cells. Furthermore, these security measures are accomplished using chip real estate and components that would otherwise be wasted, and additional other chip components would need to be fabricated to produce the same security measures accomplished using the techniques and structures disclosed herein.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
   a magnetoresistive random access memory (MRAM) array comprising:
      operational MRAM cells;
      defective MRAM cells comprising identified weak cells and failed cells, wherein the weak cells are identified by reading a resistance value from only a single write "1" signal and only a single write "0" signal; and
      redundancy MRAM cells;
   an address input electrically connected to the MRAM array; and
   a selector circuit wired to the address input and an output of the MRAM array, wherein the selector circuit controls a reading of the defective MRAM cells to identify the MRAM array.

2. The semiconductor device of claim 1, further comprising
   a defective cell address register;
   a redundancy cell decoder configured to enable the redundancy cells of the MRAM array; and
   a memory address decoder.

3. The semiconductor device of claim 2, wherein the selector circuit controls an enabling signal for the redundancy cell decoder.

4. The semiconductor device of claim 1, wherein the selector circuit comprises a multiplexer and a demultiplexer.

5. The semiconductor device of claim 4, wherein the multiplexer is electrically connected to the demultiplexer.

6. The semiconductor device of claim 1, further comprising a hash function logic block configured to output a hash value based on a reading of the defective MRAM cells.

7. The semiconductor device of claim 6, wherein the hash function logic block is configured to read the defective MRAM cells to differentiate between failed MRAM cells and weak MRAM cells.

8. The semiconductor device of claim 1, wherein the selector circuit comprises:

an operating mode configured to enable the redundancy cells; and an authentication mode configured to enable only the defective MRAM cells.

9. The semiconductor device of claim 1, wherein the redundancy MRAM cells are fabricated as a selection from the group consisting of: a redundancy row and a redundancy column.

10. A method of operating a semiconductor device, comprising:
   identifying a weak magnetoresistive random access memory (MRAM) cell of an MRAM array, wherein the weak MRAM cell is identified by reading a resistance value from only a single write "1" signal and only a single write "0" signal;
   identifying a failed MRAM cell of the MRAM array;
   identifying a redundancy MRAM cell to replace each of the weak MRAM cell and the failed MRAM cell during normal operation; and
   reading the weak MRAM cell and the failed MRAM cell to identify the MRAM array.

11. The method of claim 10, further comprising generating a hash value from the weak MRAM cell and the failed MRAM cell.

12. The method of claim 11, further comprising comparing the hash value to a stored hash value to determine an authenticity of the MRAM array.

13. The method of claim 10, wherein reading the weak MRAM cell and the failed MRAM cell comprises reading a signal selected from the group consisting of: a 00 signal, a 11 signal, a 01 signal, and a 10 signal.

14. The method of claim 10, wherein reading the weak MRAM cell and the failed MRAM cell comprises reading the address of the weak MRAM cell and the failed MRAM cell.

15. A method, comprising:
   receiving, at a selector circuit, a normal operation signal;
   in response to receiving the normal operation signal, enabling redundancy magnetoresistive random access memory (MRAM) cells within an MRAM array, wherein the redundancy MRAM cells are replacements for failed MRAM cells and weak MRAM cells in the MRAM array, wherein the weak MRAM cells are identified by reading a resistance value from only a single write "1" signal and only a single write "0" signal;
   receiving, at the selector circuit, a chip authentication signal;
   in response to receiving the chip authentication signal, reading the failed MRAM cells and the weak MRAM cells; and
   identifying the MRAM array based on the reading of the failed MRAM cells and the weak MRAM cells.

16. The method of claim 15, further comprising outputting a hash value based on the reading of the weak MRAM cells and the failed MRAM cells.

17. The method of claim 15, wherein enabling the redundancy MRAM cells comprises sending a signal from the selector circuit to a redundancy cell decoder.

18. The method of claim 15, wherein reading the weak MRAM cells and the failed MRAM cells comprises reading a signal selected from the group consisting of: a 00 signal, a 11 signal, a 01 signal, and a 10 signal.

* * * * *